(12) United States Patent
Wilhite et al.

(10) Patent No.: US 6,253,066 B1
(45) Date of Patent: Jun. 26, 2001

(54) APPARATUS AND METHOD FOR PRODUCING A PLURALITY OF OUTPUT SIGNALS WITH FIXED PHASE RELATIONSHIPS THEREBETWEEN

(75) Inventors: Jeffrey B. Wilhite, Rolling Meadows; Paul H. Gailus, Prospect Heights; Rostyslaw Zbotaniw, South Barrington, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/283,353

(22) Filed: Mar. 31, 1999

Related U.S. Application Data

(62) Division of application No. 08/957,078, filed on Oct. 24, 1997.

(51) Int. Cl.[7] .......................... H01Q 11/12; H01L 27/36
(52) U.S. Cl. ........................ 455/108; 375/298; 327/238
(58) Field of Search .................................. 455/126, 108, 455/109, 127; 375/300, 298, 261, 371; 327/238, 254, 258, 291, 295

(56) References Cited

U.S. PATENT DOCUMENTS

| | | | |
|---|---|---|---|
| 3,626,308 | 12/1971 | Paine | 328/166 |
| 4,878,188 | * 10/1989 | Ziegler, Jr. | 364/724.01 |
| 5,375,258 | * 12/1994 | Gillig | 455/87 |
| 5,410,263 | * 4/1995 | Waizman | 327/141 |
| 5,554,945 | * 9/1996 | Lee et al. | 327/105 |
| 5,808,498 | * 9/1998 | Donnelly et al. | 327/255 |
| 5,930,689 | * 7/1999 | Wilhite et al. | 455/126 |

* cited by examiner

Primary Examiner—William G. Trost
Assistant Examiner—Sheila Smith
(74) Attorney, Agent, or Firm—Jeffrey K. Jacobs

(57) ABSTRACT

An apparatus and method produce a plurality of output signals (917–921) with fixed phase relationships therebetween. The apparatus (900) includes a first signal generator (901), a second signal generator (903), and a signal processor (907). The first signal generator produces a first input signal (911) at a first frequency. The second signal generator produces a second input signal (915) at a second frequency, wherein the second frequency is an integer multiple of the first frequency. The signal processor receives the first and second input signals and produces a plurality of output signals (917–921) having fixed phase relationships therebetween at the first frequency, wherein the fixed phase relationships are based on the integer multiple and wherein each of the output signals has a single, determinate phase relative to the phase of the first input signal.

8 Claims, 6 Drawing Sheets

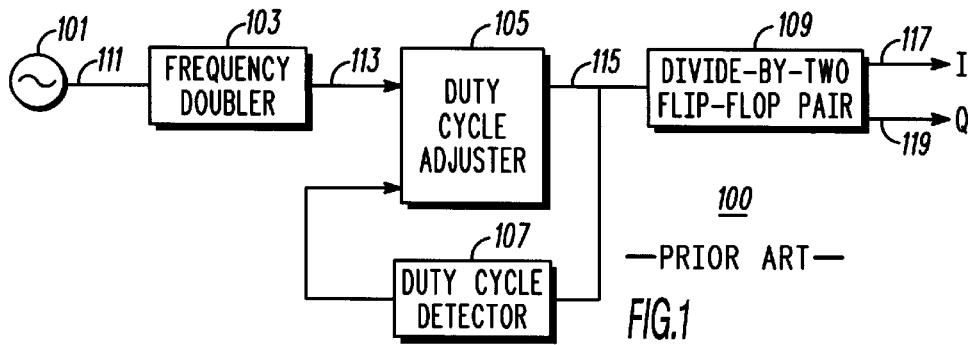
FIG.1 —PRIOR ART—
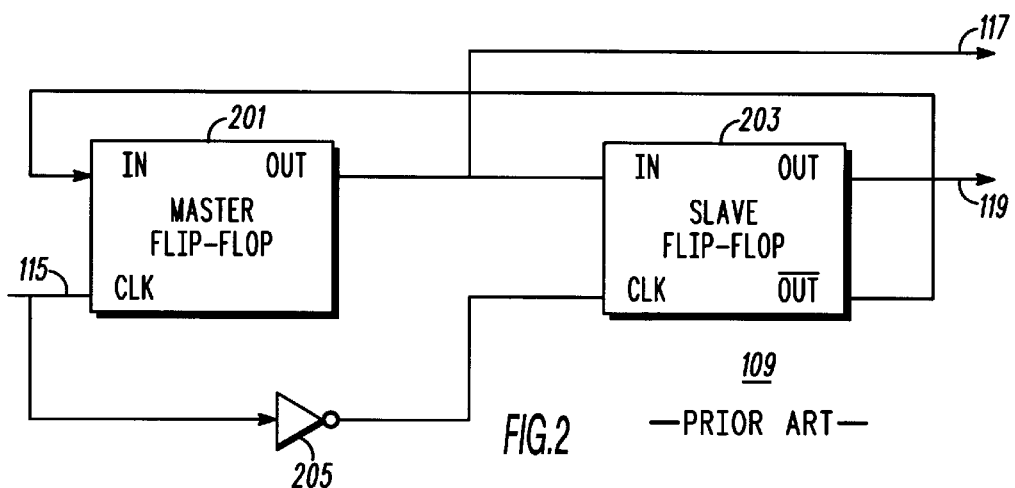
FIG.2 —PRIOR ART—
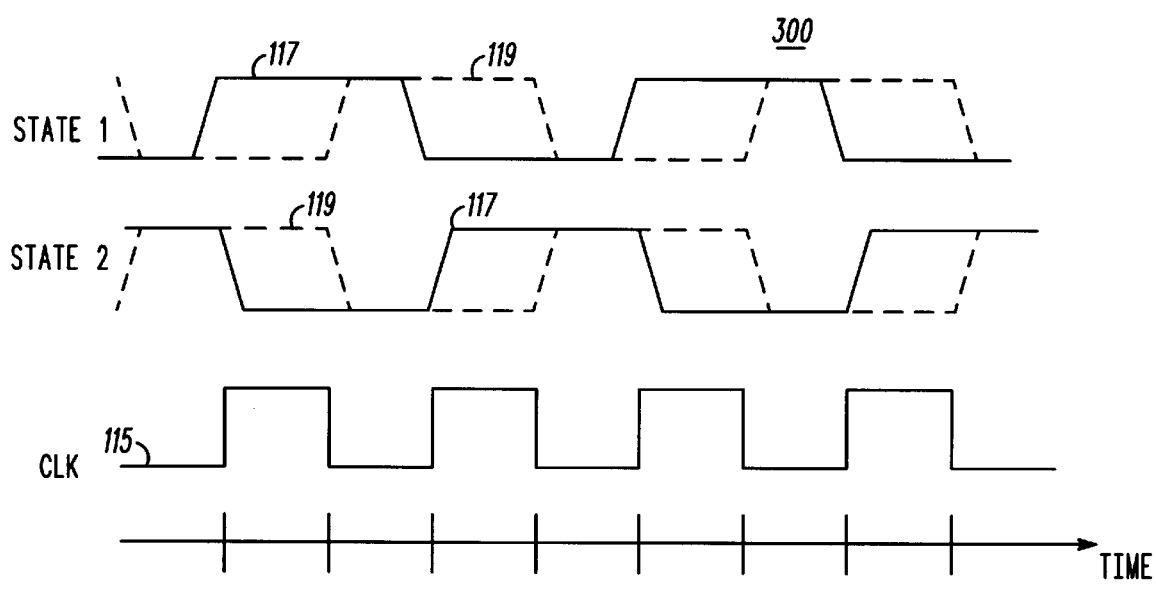
FIG.3 —PRIOR ART—

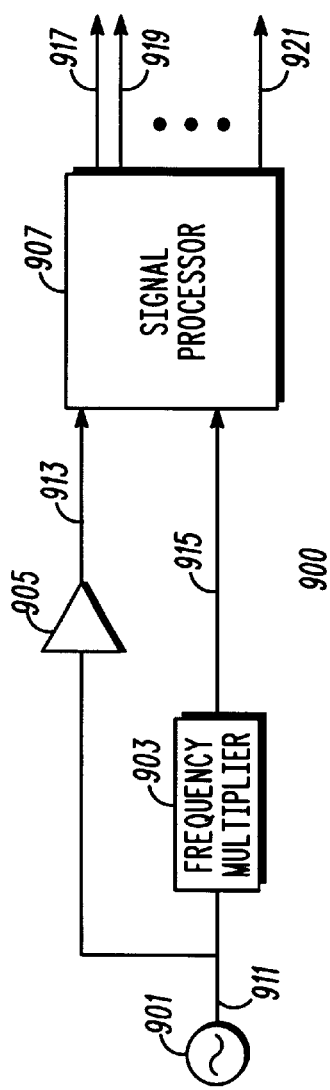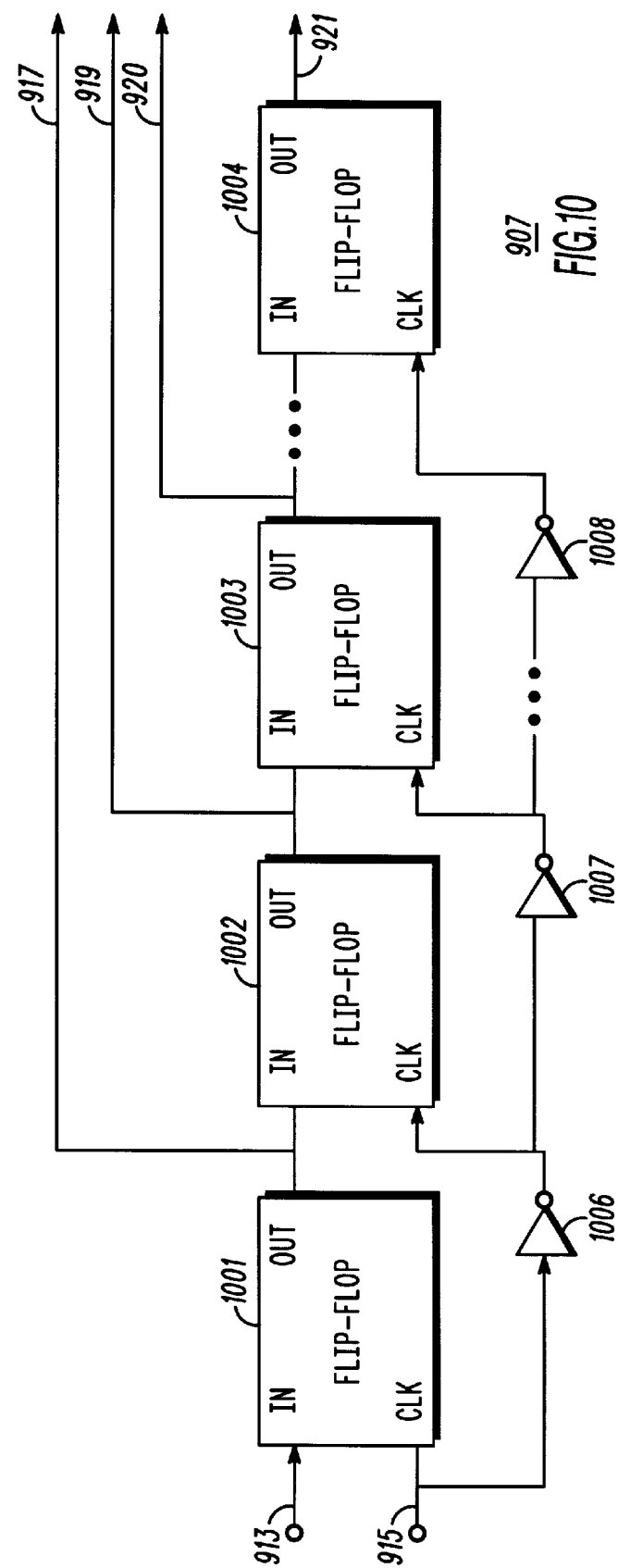

ature amplitude modulation (QAM) transmitter. Such a transmitter employs a first quadrature generator to produce the injection signals applied to the transmitter's forward path upconversion mixers and employs a second quadrature generator to produce the injection signals applied to the transmitter's feedback path down-conversion mixers.

APPARATUS AND METHOD FOR PRODUCING A PLURALITY OF OUTPUT SIGNALS WITH FIXED PHASE RELATIONSHIPS THEREBETWEEN

This application is a divisional of Ser. No. 08/957,078 Oct. 24, 1997.

FIELD OF THE INVENTION

The present invention relates generally to signal generators and, in particular, to a signal generator that produces multiple output signals with fixed phase relationships between them.

BACKGROUND OF THE INVENTION

Signal generators that produce multiple output signals with fixed phase relationships between them are known. One such signal generator is a quadrature generator. A quadrature generator is typically utilized to apply the sine and cosine components of a carrier frequency to a pair of mixer circuits in a quadrature amplitude modulator or demodulator.

One known embodiment of a wideband, quadrature generator 100 is depicted in FIG. 1. The quadrature generator 100 includes a clock oscillator 101, a frequency doubler 103, a duty cycle adjuster 105, a duty cycle detector 107, and a divide-by-two circuit 109. The clock oscillator 101 produces a first clock signal 111 at a desired output carrier frequency. The frequency doubler 103 receives the first clock signal 111 and produces a second clock signal 113 at twice the frequency of the first clock signal 111. However, the frequency doubler 103 does not typically produce a clock signal 113 having a 50—50 (i.e., 50%) duty cycle. Thus, the second clock signal 113 is applied to the duty cycle adjuster 105 which, in combination with the duty cycle detector 107, produces a third clock signal 115 at twice the frequency of the first clock signal 111. However, due to collective operation of the duty cycle adjuster 105 and the duty cycle detector 107, the third clock signal 115 has an exact 50—50 duty cycle which is necessary to enable the divide-by-two circuit 109 to produce output signals 117, 119 that are in perfect phase quadrature with one another. The divide-by-two circuit 109 then receives the third clock signal 115 and generates quadrature output signals (I) 117 and (Q) 119.

The divide-by-two circuit 109 is depicted in more detail in FIG. 2. The divide-by-two circuit 109 includes two flip-flops 201, 203 configured in a master-slave arrangement and an inverter 205. The master flip-flop 201 receives at its clock (CLK) input the third clock signal 115 and produces at its output the in-phase (I) quadrature output signal 117. The slave flip-flop 203 receives, at its data input, the I quadrature output signal 117 and, at its clock input, an inverted representation of the third clock signal 115. The slave flip-flop 203 then produces the Q quadrature output signal 119, which is 90 degrees out-of-phase with respect to the I quadrature output signal 117. The Q quadrature output signal 119 is also fed back to the data input of the master flip-flop 201 to provide the symmetry necessary to allow the two flip-flops 201, 203 to produce output signals 117, 119 in exact phase quadrature with each other. More detailed operation of the quadrature generator 100 and the divide-by-two circuit 109 can be found in U.S. Pat. No. 5,375,258.

Although the prior art divide-by-two circuit 109 provides output signals 117, 119 in exact phase quadrature with each other as is optimal for a quadrature generator, the state of the divide-by-two circuit 109 when the clock signal 115 is interrupted is indeterminate. Thus, the phase relationship between the first input signal 111 and the quadrature output signals 117, 119 is not predictable. In practicality, after a clock signal interruption, the divide-by-two circuit 109 has an equal probability of returning to operation in any one of two states. Timing diagrams 300 showing the two equally probably start-up states for the divide-by-two circuit 109 are depicted in FIG. 3. The two equally probable start-up states of the divide-by-two circuit 109 result in quadrature output signals having varying output phases at identical clock times. As shown, the phases of the output signals in state 1 are 180 degrees out-of-phase with respect to the phases of the output signals in state 2. Since either state is equally likely depending upon the time of the clock interruption, any quadrature generator that requires a predictable phase relationship between first input signal 111 and the quadrature output signals 117, 119 would not be able to use the divide-by-two circuit 109 to produce the quadrature output signals 117, 119.

One type of quadrature generator that requires a predictable phase relationship between the first input signal 111 and the quadrature output signals 117, 119 is a quadrature generator used in a Cartesian feedback, linear quadrature amplitude modulation (QAM) transmitter. Such a transmitter employs a first quadrature generator to produce the injection signals applied to the transmitter's forward path upconversion mixers and employs a second quadrature generator to produce the injection signals applied to the transmitter's feedback path down-conversion mixers.

To maintain their linearity, Cartesian feedback transmitters typically "train" their negative feedback loops periodically to insure a 180-degree phase shift around the loop. During each training period, the transmitter opens the feedback loop, conveys a training signal around the loop, measures the phase of the loop, and adjusts the phase of the loop as necessary to obtain the desired 180 degrees of phase shift. Consequently, to maintain the feedback loop phase at 180 degrees after return to normal transmitter operation, the phase changes introduced by the transmitter elements must be substantially the same during and immediately after the training period.

To adjust the loop phase, the phase of the clock signal applied to the down-conversion mixers is altered to achieve the desired 180-degree phase shift around the feedback loop. When training is over, the transmitter will operate normally only if the output phases of the quadrature output signals have not changed substantially since training. However, since the start-up phase of the divide-by-two circuit 109 can produce signals 117, 119 with indeterminate absolute phases, such a circuit, if used, could cause the transmitter's feedback loop to become unstable if the start-up phases of the output signals 117,119 were 180 degrees out-of-phase with their expected phases. For example, if during training, the down-conversion mixers each introduced a ten degree phase change, but then, upon closing the feedback loop, the down-conversion mixer introduced a 190 degree phase change due to the state of the quadrature generator supplying the down-conversion mixers, the loop phase would now be zero degrees instead of 180 degrees, thereby resulting in positive feedback, loop instability, and possible transmitter destruction.

Therefore, a need exists for an apparatus and method for producing a plurality of output signals with fixed phase relationships therebetween that have, at all times, a single, determinate phase relationship with the input signal used to generate them. Such an apparatus and method that could be used to implement a quadrature generator in a Cartesian feedback transmitter would be an improvement over the prior art.

BRIEF DESCRIPTION OF THE DRAWINGS

FIG. 1 illustrates a prior art quadrature generator.

FIG. 2 illustrates a prior art implementation of a divide-by-two circuit that is used in the quadrature generator of FIG. 1.

FIG. 3 illustrates timing diagrams showing two equally probable start-up states for the divide-by-two circuit of FIG. 2.

FIG. 9 illustrates a signal generator that produces a plurality of output signals with fixed phase relationships therebetween in accordance with the present invention.

FIG. 10 illustrates one embodiment of a signal processor used in the signal generator of FIG. 9.

DESCRIPTION OF A PREFERRED EMBODIMENT

Generally, the present invention encompasses an apparatus and method for producing a plurality of output signals with fixed phase relationships therebetween. The apparatus includes a first signal generator, a second signal generator, and a signal processor. The first signal generator produces a first input signal at a first frequency. The second signal generator produces a second input signal at a second frequency, wherein the second frequency is an integer multiple of the first frequency. The signal processor receives the first and second input signals and produces a plurality of output signals at the first frequency having fixed phase relationships between them, wherein the fixed phase relationships are based on the integer multiple and wherein each of the output signals has a single, determinate phase relative to the phase of the first input signal. By producing output signals with direct phase relationships to the input signals in this manner, the present invention permits use of the apparatus as a quadrature generator in the upconverter and down-converter of a negative feedback transmitter. In contrast to prior art signal generators that produce output signals having any one of a plurality of possible phases with respect to the input signal at any given start-up time, the present invention fixes the phase relationship between the input signal and the output signals to a single, determinate value (albeit any single, determinate value) regardless of the start-up time to enable the negative feedback transmitter to accurately compensate for the phase shift introduced to the forward path and feedback path signals by the apparatus.

Figure 4:
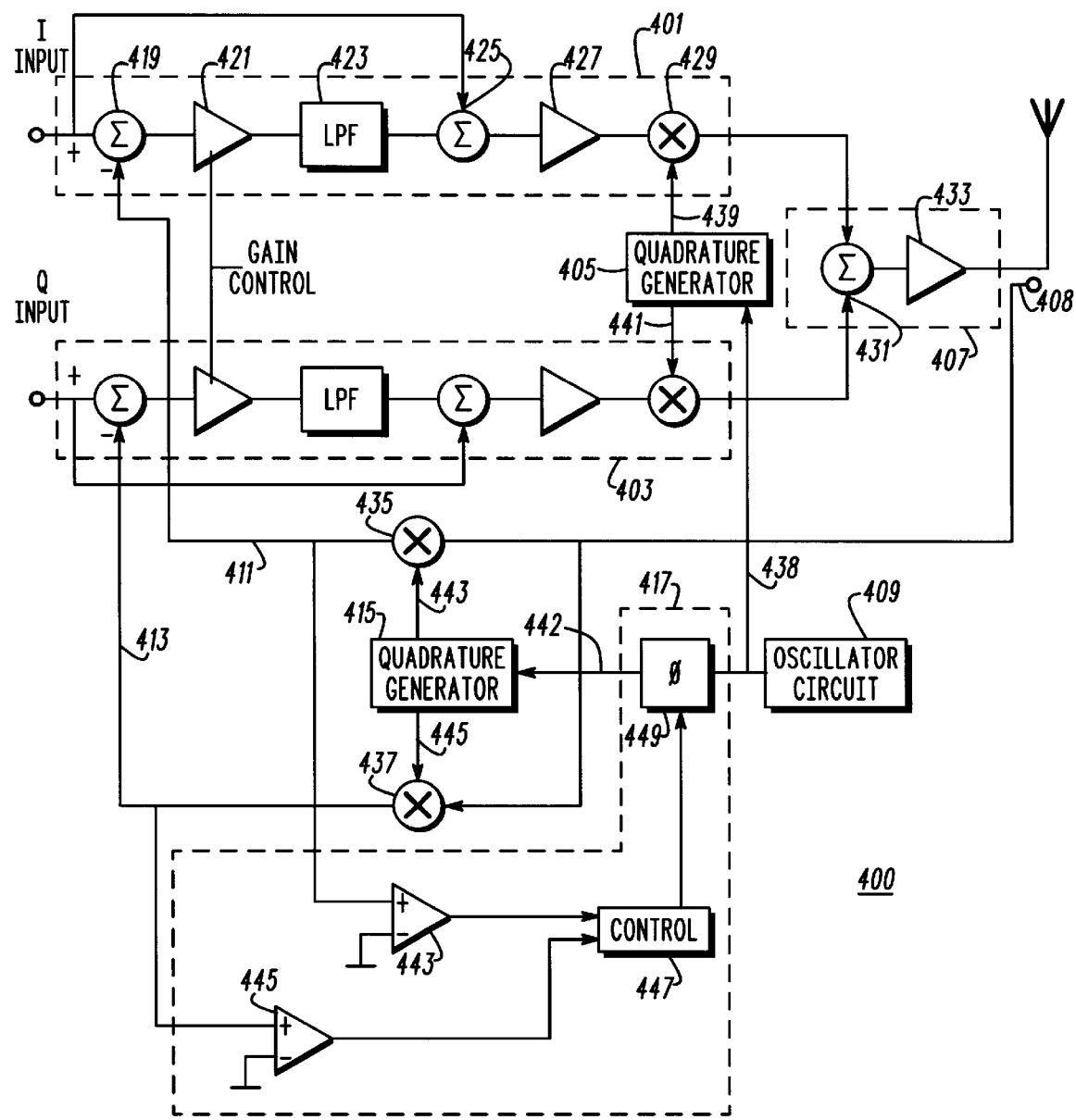
FIG. 4 illustrates a block diagram depiction of a linear transmitter in accordance with the present invention.

The present invention can be more fully understood with reference to FIGS. 4–11. FIG. 4 illustrates a block diagram depiction of a Cartesian feedback linear transmitter 400 in accordance with the present invention. The transmitter 400 includes first and second information signal paths 401, 403, first and second quadrature generators 405, 415, a combined information signal path 407, an oscillator circuit 409, first and second feedback paths 411, 413, and a phase adjustment circuit 417. Each of these generally referred to elements will now be described in more detail in seriatim fashion.

The first and second information signal paths 401, 403 are identical to one another in this embodiment. They differ only in that the first path 401 receives an in-phase (I) baseband information input signal; whereas, the second path 403 receives a quadrature (Q) baseband information input signal. Therefore, only the first path 401 will be described in detail.

The first information path 401 couples its input to a differential summer 419. The remaining input to this differential summer 419 couples to the first feedback path 411. The summer 419 output couples to a variable gain baseband amplifier 421 that itself couples through a lowpass filter 423 to a summer 425. The remaining input to this summer 425 couples to the I input to support open loop operation. The output of the summer 425 passes through another amplification stage 427 to a mixer 429 that up-converts the incoming baseband signal to a predetermined carrier frequency of choice. The injection signals 439, 441 for the mixers 429 are provided by the first quadrature generator 405. The first quadrature generator 405 receives as its input signal 438 the local oscillator signal produced by the oscillator circuit 409. The first and second quadrature generators 405, 415 in this embodiment of the linear transmitter 400 are identical and will be described in more detail below with respect to FIGS. 5–8.

The outputs of both information signal paths 401, 403 couple to the inputs of a summer 431 that represents the input to the combined information signal path 407. The output of the summer 431 couples to the input of an amplifier 433 which provides the amplifier signal to the antenna. A coupler 408 responsive to the output of the amplifier 433 provides a feedback signal to both the first and second feedback paths 411,413. The upconverted signal as obtained from the output of amplifier 433 is first down-converted through appropriate mixers 435, 437 and then provided to the subtractive inputs of the first and second information signal path differential summers 419 as mentioned above. The down-conversion injection signals 443, 445 for the feedback path mixers 435, 437 are provided in quadrature to one another via the second quadrature generator 415.

The phase shift unit 417 provides comparators 443, 445 to detect phase differences between the I and Q inputs and the two feedback paths 411, 413 and to provide any differential information to a control unit 447 that in turn controls a phase shifter 449 coupled between the oscillator circuit 409 and the second quadrature generator 415. The control unit 447 adjusts the phase introduced by the phase shifter 449 to insure negative feedback operation of the feedback paths 411,413. The phase shifter 449 provides the input signal 442 to the second quadrature generator 415 as a phase-shifted version of the oscillator circuit's local oscillator output signal 438.

The above blocks will be generally understood by those skilled in the art. In addition, further details regarding the operation of the linear transmitter 400, operation of the variable gain baseband amplifier 421, and operation of the phase shift adjustment circuit 417 can be found respectively in U.S. Pat. Nos. 5,066,923; 5,041,793; and 5,134,718. All of these documents are incorporated herein by this reference.

Figure 5:
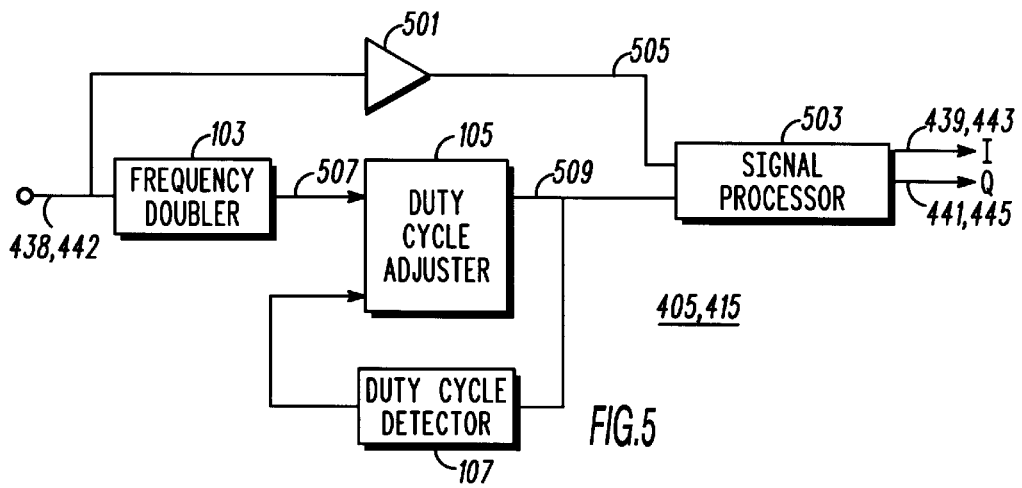
FIG. 5 illustrates a preferred embodiment of a quadrature generator in accordance with the present invention.

FIG. 5 illustrates a preferred embodiment of the quadrature generators 405, 415 depicted in FIG. 4. The preferred quadrature generator 405, 415 includes the frequency doubler 103, duty cycle adjuster 105, and duty cycle detector 107 described above with regard to the prior art quadrature generator 100 of FIG. 1. In addition, the preferred quadrature generator 405, 415 includes a delay circuit, which in the preferred embodiment comprises a buffering amplifier 501, and a signal processor 503. The buffering amplifier 501 delays the input signal 438, 442 to the quadrature generator 405, 415 by an amount of time that approximates the time delay of the serial combination of the frequency doubler 103 and the duty cycle adjuster 105 less a period of the frequency of the input signal 438, 442 divided by four. However, since the time delay introduced by the duty cycle adjuster 105 is substantially less than the delay introduced by the frequency doubler 103, the time delay selected for the buffering amplifier 501 is approximately (e.g., at an input signal frequency of 800 Megahertz (MHz), within one nanosecond of) the time delay of the frequency doubler 103 less a period of the frequency of the input signal 438, 442 divided by four. That is, the preferred delay introduced by the buffering amplifier 501 is given by the following equation:

$$\partial_{buffer} = \partial_{doubler} - (T/4),$$

where $\partial_{buffer}$ is the time delay of the buffering amplifier 501, $\partial_{doubler}$ is the time delay introduced by the frequency doubler 103, and T is the period of the input signal 438, 442.

Similarly, in an embodiment of the quadrature generator 405, 415 that does not incorporate the duty cycle adjuster 105 and provides a direct coupling between the frequency doubler 103 and the signal processor 503, the buffering amplifier 501 or other delay circuit would delay the input signal 438, 442 by an amount of time that approximates the time delay of the frequency doubler 103 less a period of the frequency of the input signal 438, 442 divided by four. The frequency doubler 103, duty cycle adjuster 105, duty cycle detector 107, and buffering amplifier 501 are known and will be generally understood by those skilled in the art. In addition, further details regarding the operation of the frequency doubler 103, duty cycle adjuster 105, and duty cycle detector 107 can be found in U.S. Pat. No. 5,375,258, which is incorporated herein by this reference.

Operation of the preferred quadrature generator 405, 415 occurs substantially as follows. Upon receiving the input signal 438, 442, the frequency doubler 103 produces an output signal 507 at twice the frequency of the input signal 438, 442. In general, the duty cycle of the frequency doubler 103 is not exactly 50%, which 50% duty cycle is necessary to allow the signal processor 507 to produce two output signals having a phase relationship between them of exactly 90 degrees (i.e., to produce two output signals in exact phase quadrature with one another). To compensate for the imperfect duty cycle of the frequency doubler 103, the output signal 507 of the frequency doubler 103 is applied to duty cycle adjuster 105 which, in combination with the duty cycle detector 107, produces an input signal 509 to the signal processor that is at twice the frequency of the input signal 438, 442 to the quadrature generator 405, 415 and that has an exact 50% duty cycle.

To account for the time (phase) delay introduced by the frequency doubler 103 and duty cycle adjuster 105, the quadrature generator's input signal 438, 442 is applied to the buffering amplifier 501. As described above, the buffering amplifier 501 is designed to delay the input signal 438, 442 by an amount of time that approximates the time delay of the frequency doubler 103 less a period of the frequency of the input signal 438, 442 divided by four.

The signal processor 503 receives the two processor input signals 505, 509 and produces two quadrature output signals (e.g., 439 and 441 or 443 and 445) at the frequency of the quadrature generator's input signal 438, 442 that are offset in phase from each other by 90 degrees and that are offset in phase from the quadrature generator's input signal 438, 442 by the sum of the phases introduced by the signal processor 503 and the combination of the frequency doubler 103 and the duty cycle adjuster 105. However, in contrast to signal processors (e.g., divide-by-two circuits) of prior art quadrature generators, the signal processor 503 of the present invention introduces a single phase offset with respect to the quadrature generator's input signal 438, 442 regardless of the start-up time or state of the signal processor 503 because the output signals 439, 441 or 443, 445 are produced directly from a time-delayed representation (i.e., signal 505) of the quadrature generator's input signal 438, 442. Detail and operation of embodiments of the quadrature generator's signal processor 503 are described below with respect to FIGS. 6 and 7.

Figure 6:
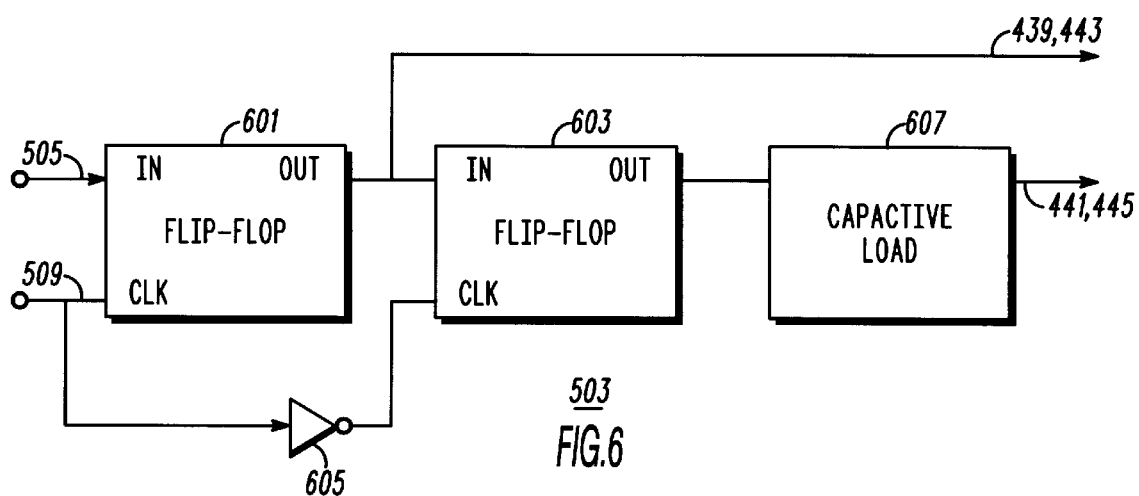
FIG. 6 illustrates a preferred embodiment of a signal processor used in the quadrature generator of FIG. 5.

FIG. 6 illustrates a preferred embodiment of the signal processor 503 used in the preferred quadrature generator 405, 415 of FIG. 5. The preferred signal processor 503 includes first and second flip-flops 601, 603, an inverter 605, and a capacitive load 607. In the preferred embodiment, the flip-flops 601, 603 comprise analog differential flip-flops, such as D latch flip-flops. The inverter 605 is shown for schematic purposes only and, in the preferred embodiment, is not a separate, physical element. Instead, the inverting function of the inverter 605 is accomplished by exchanging the connection of two differential lines in accordance with known techniques.

The capacitive load 607 preferably comprises one or more distributed capacitors. The capacitances of the distributed capacitors are selected to approximate the input impedance of a flip-flop (e.g., 601). Without the capacitive load 607, the second flip-flop 603 would be loaded by whatever device was connected to it. In the linear transmitter of FIG. 4, the second flip-flop 603 is loaded by a mixer (e.g., 429); whereas, the first flip-flop 601 is loaded by a mixer 429 and an input of the second flip-flop 603. Therefore, both flip-flops 601, 603 do not have identical loads and unsymmetric operation of the signal processor 503 may result. To compensate for the lack of symmetry, the preferred signal processor 503 incorporates the capacitive load 607 to approximate the input impedance of a flip-flop. In an alternative embodiment, the capacitive load 607 might comprise a powered-up flip-flop.

Operation of the preferred signal processor 503 occurs substantially as follows. The first flip-flop 601 receives the processor input signals 505, 509. Processor input signal 505 is applied to a first, or data, input of the first flip-flop 601 and processor input signal 509 is applied to a second, or clock (CLK), input of the first flip-flop 601. In the preferred embodiment, the flip-flops 601, 603 are differential flip-flops; thus, the processor input signals 505, 509 are also differential. The first flip-flop 601 preferably samples input signal 505 during a negative cycle of input signal 509 to produce its output signal. The output of the first flip-flop 601 comprises the I quadrature output signal 439, 443 and is also applied to a first, or data, input of the second flip-flop 603. The second, or clock, input of the second flip-flop 603 receives an inverted representation of processor input signal 509. Thus, the second flip-flop 603 preferably samples the output signal of the first flip-flop 601 during a positive cycle of input signal 509 to produce its output signal. The output signal of the second flip-flop 603 then passes through the capacitive load 607 to produce the Q quadrature output signal 441, 445, which is offset in phase by 90 degrees with respect to the I quadrature output signal 439, 443. Because the first flip-flop's output signal is produced directly from a representation of the quadrature generator's input signal 438, 442, the phases of both quadrature output signals 439, 443 and 441, 445 vary directly as a function of the current phase of the quadrature generator's input signal 438, 442. That is, the phases (in degrees) of the I and Q quadrature output signals 439, 443 and 441,445 can be written as follows:

$$\theta_I = \theta_{in} + \theta_C + \theta_{SP}$$
$$\theta_Q = \theta_{in} + \theta_C + \theta_{SP} + 90$$

where $\theta_I$ is the phase of the I quadrature output signal 439, 443;

$\theta_Q$ is the phase of the Q quadrature output signal 441, 445;

$\theta_{in}$ is the phase of the quadrature generator's input signal 438,442, $\theta_C$ is the phase change introduced by the combination of the frequency doubler 103 and the duty cycle adjuster 105; and $\theta_{SP}$ is the constant phase change introduced by the signal processor 503.

Thus, as evidenced by the equations above, the phase of each quadrature output signal 439, 443 and 441, 445 is a single, determinate phase relative to the phase of the quadrature generator's input signal 438, 442 regardless of the state of the flip-flops 601, 603 in the signal processor. By producing output signals having fixed phase offsets relative to its input signal 438, 442, the quadrature generator 405, 415 of the present invention facilitates use in the Cartesian feedback transmitter 400. As briefly discussed above, the transmitter 400 employs a phase adjustment circuit 417 to compensate the loop phase to insure negative feedback. Such transmitters use periodic training sequences to permit the phase adjustment circuit 417 to adjust the feedback loop phase to be 180 degrees. Thus, each training sequence is predicated on the condition that immediately after training, the feedback loop phase will be approximately 180 degrees. However, during a portion of the training sequence when the transmitter 400 is determining and adjusting the loop phase, a phase of the input signal to the feedback path quadrature generator 415 is altered to achieve a loop phase of 180 degrees. Thus, without the present invention (e.g., when using the quadrature generator described in U.S. Pat. No. 5,375,258), the quadrature generator 415 could continue after training in any one of two states as discussed above and, if it continues in the undesired state, completely destroy the phase training that was just performed, thereby resulting in improper operation and instability of the linear transmitter 400. By contrast, with the present invention, phase training is not affected because the phase introduced by the quadrature generator 415 remains constant before and after training.

Figure 7:
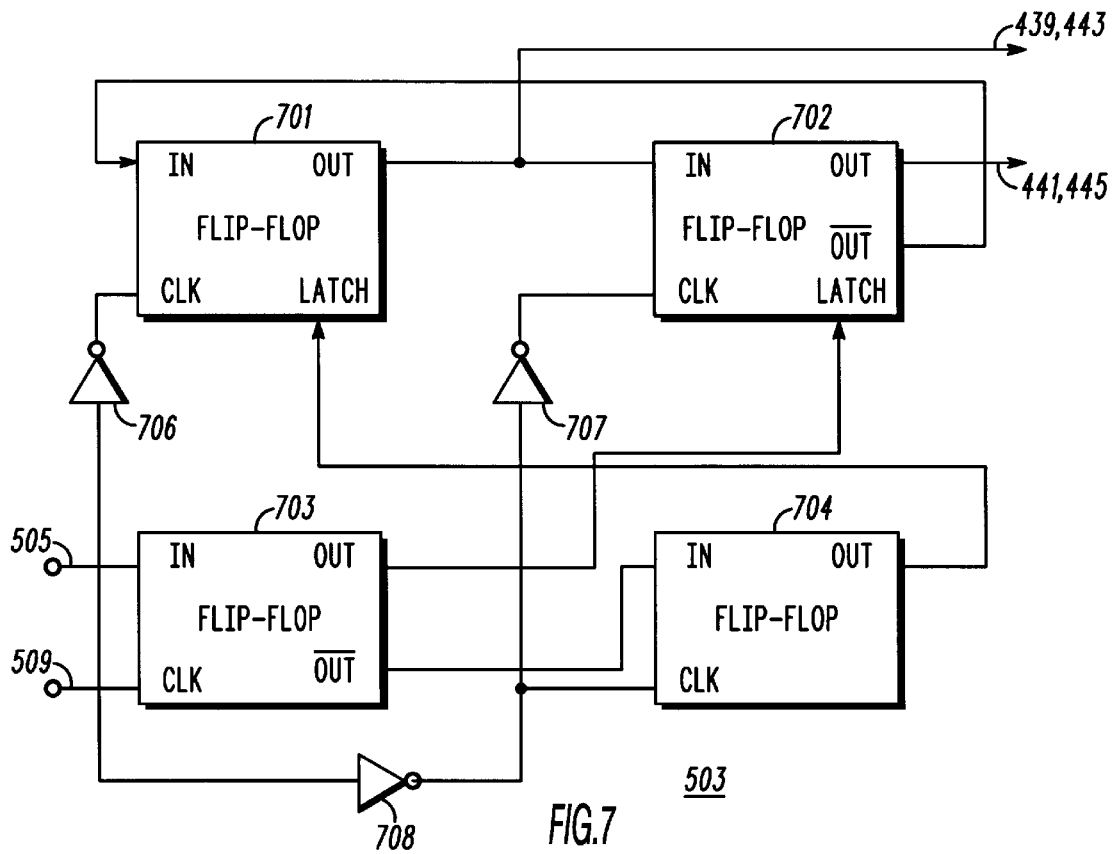
FIG. 7 illustrates an alternative embodiment of the signal processor used in the quadrature generator of FIG. 5.

FIG. 7 illustrates an alternative embodiment of the signal processor 503 used in the preferred quadrature generator 405, 415 of FIG. 5. The alternative signal processor 503 includes four flip-flops 701–704 and three inverters 706–708. The flip-flops 701–704 preferably comprise analog differential flip-flops, such as D latch flip-flops. The inverters 706–708 are shown for schematic purposes only and, in the alternative embodiment, are not separate, physical elements. Instead, the inverting function of the inverters 706–708 is accomplished by exchanging the connection of two differential lines in accordance with known techniques.

As shown, the clock signal applied to flip-flops 702 and 703 is the frequency doubled output signal (signal 509) of the duty cycle adjuster 105; whereas the clock signal applied to flip-flops 701 and 704 is an inverted representation of the frequency doubled output signal (signal 509) of the duty cycle adjuster 105. Flip-flop 703 receives the output of the buffering amplifier (signal 505) at its data input and produces an output signal that is applied to a latch input of flip-flop 702. The inverted output of flip-flop 703 is applied to the data input of flip-flop 704. Flip-flop 704 then produces an output signal that is applied to the latch input of flip-flop 701. Flip-flop 701 receives at its data input the inverted output signal of flip-flop 702 and produces an output signal that is applied to the data input of flip-flop 702 and that constitutes the I quadrature output signal 439, 443. Flip-flop 702 produces an output signal that constitutes the Q quadrature output signal 441, 445.

In effect, the alternative signal processor 503 depicted in FIG. 7 uses two sets of flip-flops to achieve both a direct phase relationship between the input signal 438, 442 of the quadrature generator 405, 415 and the quadrature output signals 439, 441, 443, 445, and good symmetry for desired radio frequency performance. Flip-flops 703 and 704 form a circuit that is very similar to the circuit formed by flip-flops 601 and 603 of FIG. 6. That is because flip-flop 703 samples input signal 505 during one phase of input signal 509, while flip-flop 704 latches, and then latches the sampled signal during the opposite phase of input signal 509, while flip-flop 704 samples the output of flip-flop 703. Flip-flops 701 and 702 are forced to assume phases that relate to the phase of the quadrature generator's input signal 438, 442 by latching the output signals of flip-flops 703 and 704.

Flip-flop 701 latches the output of flip-flop 704 during one phase of input signal 509, while flip-flop 702 samples the output of flip-flop 701. On the opposite phase of input signal 509, flip-flop 702 latches the output of flip-flop 703, while flip-flop 701 samples the output of flip-flop 702. In this manner, flip-flops 701 and 702 are forced into a desired phase relationship with the quadrature generator's input signal 438, 442 by latching the output signals of flip-flops 703 and 704, while achieving symmetrical operation by requiring flip-flop 701 to sample the inverted output of flip-flop 702 and requiring flip-flop 702 to sample the output of flip-flop 701. Thus, in contrast to the preferred signal processor 503 depicted in FIG. 6, because flip-flops 701 and 702 have symmetrical loading on each flip-flop's respective output, a capacitive load is not needed to load flip-flop 702 in order to achieve symmetrical operation. However, it should be noted that in order to achieve the desired operational symmetry at radio frequencies with the alternative signal processor 503 depicted in FIG. 7, care should be used in laying out the signal processor 503 to minimize the crossing of lines that carry radio frequency signals.

Figure 8:
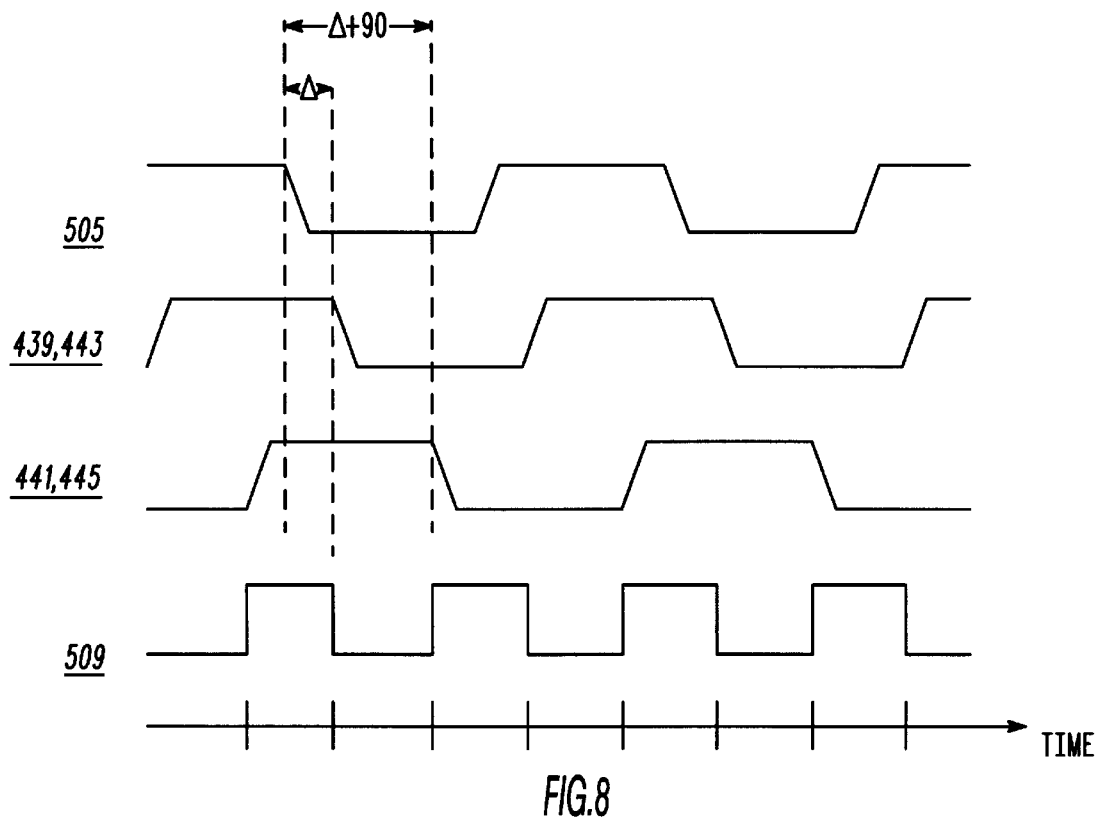
FIG. 8 illustrates phase relationships between input and output signals of signal processors used in the quadrature generators of FIGS. 5 and 6.

FIG. 8 illustrates phase relationships between input and output signals of the signal processors 503 of FIGS. 5 and 6. As shown, input signal 509 (i.e., the clock signal), the I quadrature output signal 439, 443, and the Q quadrature output signal 441,445 all have direct phase relationships with input signal 505 to the signal processor 503. The phase relationship between input signal 505 and input signal 509 is equivalent to the phase relationship between input signal 505 and the I quadrature output signal 439, 443, and is denoted in FIG. 8 by $\Delta$. That is, the I quadrature output signal 439, 443 is equivalent to input signal 505 delayed by $\Delta$ degrees. The phase relationship between input signal 505 and the Q quadrature output signal 441, 445 is $\Delta$+90 degrees. That is, the Q quadrature output signal 441, 445 is equivalent to input signal 505 delayed by Δ+90 degrees. Therefore, each of the quadrature output signals 439, 441, 443, 445 has a single, determinate phase relationship with respect to the phase of the processor's input signal 505 and, accordingly, the phase of the quadrature generator's input signal 438, 442.

FIG. 9 illustrates a signal generator 900 that produces a plurality of output signals 917–921 with fixed phase relationships therebetween in accordance with the present invention. The signal generator 900 includes a first signal generator 901, a second signal generator, a delay circuit, and a signal processor 907. In a preferred embodiment, the first signal generator 901 comprises a phase-locked oscillator, such as a voltage-controller oscillator (VCO), the second signal generator comprises a frequency multiplier 903 coupled to the output of the first signal generator 901, and the delay circuit comprises a buffering amplifier 905. VCOs, frequency multipliers, and buffering amplifiers are known and will be generally understood by those skilled in the art. The signal processor 907 will be described in detail below with respect to FIG. 10.

Operation of the signal generator 900 occurs substantially as follows in accordance with the present invention. The first signal generator 901 generates an output signal 911 at a particular radio frequency (e.g., 800 MHz) in accordance with known techniques and provides the output signal 911 to the inputs of the frequency multiplier 903 and the buffering amplifier 905. The frequency multiplier 903 receives signal 911 and produces an output signal 915 at a frequency that is an integer multiple of the first signal generator's output signal 911. The selected integer multiple corresponds to the number of desired output signals 917–921. For example, when three output signals 917–921 are desired, the integer multiple is three and the frequency multiplier 903 produces an output signal 915 at three times the frequency of its input signal 911. The frequency multiplier 903 then provides its output signal 915 to one input of the signal processor 907.

The buffering amplifier 905 receives the first signal generator's output signal 911 and preferably delays the signal 911 by an amount of time that approximates the time delay of the frequency multiplier 903 less a period of the frequency of the first signal generator's output signal 911 divided by twice the integer multiple. That is, the preferred delay introduced by the buffering amplifier 905 is given by the following equation:

$$\partial_{buffer} \approx \partial_{multiplier} - (T/(2 \times N)),$$

where $\partial_{buffer}$ is the time delay of the buffering amplifier 905, $\partial_{multiplier}$ is the time delay introduced by the frequency multiplier 903, T is the period of the first signal generator's output signal 911, and N is the integer multiple indicating the number of output signals 917–921 and the multiplication factor used by the frequency multiplier 903. The buffering amplifier 905 then provides the time-delayed (an accordingly phase-delayed) representation 913 of the first signal generator's output signal 911 to an input of the signal processor 907.

Use of existing analog circuitry may make an attempt to design a buffering amplifier 905 that has a time delay equivalent to the time delay of the frequency multiplier 903 difficult. Accordingly, practical limits for the time delay introduced by the buffering amplifier 905 can be given as follows. First, when the time delay of the frequency multiplier 903 is between T/N and T/(2×N), and the signal processor 907 is sampling signal 913 during a negative cycle of signal 915, the time delay of the buffering amplifier 905 should be less than $[\partial_{multiplier} - (T/(2 \times N))]$—i.e., $\partial_{buffer} < \partial_{multiplier} - (T/(2 \times N))$. Alternatively, when the time delay of the frequency multiplier 903 is between zero and T/(2×N), and the signal processor 907 is sampling signal 913 during a positive cycle of signal 915, the time delay of the buffering amplifier 905 should be greater than $[\partial_{multiplier} - (T/(2 \times N))]$ and the time delay of the buffering amplifier 905 should be less than the time delay of the frequency multiplier 903—i.e., $\partial_{buffer} > \partial_{multiplier} - (T/(2 \times N))$ and $\partial_{buffer} < \partial_{multiplier}$.

Upon receiving the output signal 913 of the buffering amplifier 905 and the output signal 915 of the frequency multiplier 903, the signal processor 907 produces the output signals 917–921 as described below, such that each output signal 917–921 is at the frequency of the first signal generator's output signal 911, has a phase relationship with each other output signal 917–921 that is based on the integer multiple, N, and has a single, determinate phase relative to the phase of the first signal generator's output signal 911. For example, when the first signal generator's output signal 911 has a phase of 0 degrees and the integer multiple is three, the phase of each output signal 917–921 can be written as follows:

$$\theta_1 = \theta + \theta_C + \theta_{SP}$$

$$\theta_2 = \theta + \theta_C + \theta_{SP} + 60$$

$$\theta_3 = \theta + \theta_C + \theta_{SP} + 120$$

where
$\theta_1$ is the phase of the first output signal 917;
$\theta_2$ is the phase of the second output signal 919;
$\theta_3$ is the phase of the third output signal 921,
$\theta_C$ is the phase change introduced by the frequency multiplier 903; and
$\theta_{SP}$ is the constant phase change introduced by the signal processor 903.

An exemplary embodiment of the signal processor 907 is depicted in FIG. 10 and discussed below.

In an alternative embodiment, the signal generator 900 may further include additional circuitry, such as a duty cycle adjuster and a duty cycle controller, between the frequency multiplier 903 and the signal processor 907. In such an embodiment, the buffering amplifier 501 or other delay circuit would delay the first signal generator's output signal 911 by an amount of time that approximates the combined time delay of the frequency multiplier 903 and the additional circuitry less a period of the frequency of the first signal generator's output signal 911 divided by twice the integer multiple if the additional circuitry introduces a time delay that is a substantial percentage (e.g., 10% or more) of the time delay introduced by the frequency multiplier 903. If the additional circuitry does not introduce a time delay that is a substantial percentage of the time delay introduced by the frequency multiplier 903, the buffering amplifier 905 need only delay the first signal generator's output signal 911 by an amount of time that approximates the time delay of the frequency multiplier 903 less a period of the frequency of the first signal generator's output signal 911 divided by twice the integer multiple.

In yet another embodiment, the frequency multiplier 903 might be removed and a second, independent signal generator might be used to provide the second input signal 915 to the signal processor 907. However, such a second, independent signal generator must produce an output signal that is a desired integer multiple of the output signal 911 of signal generator 901 in order to produce the desired phase relationships between the output signals 917–921. In this case, signal generator 901 would supply signal 911 directly to the buffering amplifier 905 and the second, independent signal generator would supply signal 915 either directly to the signal processor 907 or through additional circuitry (e.g., a duty cycle adjuster) to the signal processor 907. If additional circuitry was not included between the second, independent signal generator and the signal processor 907, the buffering amplifier 905 or other equivalent delay circuit could also be excluded, and the output signal 911 of signal generator 901 could be applied directly to the signal processor 907 as signal 913.

FIG. 10 illustrates one embodiment of the signal processor 907 used in the signal generator 900 of FIG. 9. The signal processor 907 includes a plurality of flip-flops 1001–1004 and a plurality of inverters 1006–1008. The number of flip-flops 1001–1004 required in this embodiment is equivalent to the integer multiple, N. Thus, if four output signals 917–921 are desired, four flip-flops 1001–1004 must be used. The number of inverters 1006–1008 that are required is one less than the number of flip-flops. The flip-flops 1001–1004 preferably comprise analog differential flip-flops, such as D latch flip-flops. The inverters 1006–1008 are shown for schematic purposes only and, in this embodiment, are not separate, physical elements. The inverting function of the inverters 1006–1008 is accomplished by exchanging the connection of two differential lines in accordance with known techniques.

Operation of the signal processor 907 substantially parallels operation of the signal processor 503 of FIG. 6. The first flip-flop 1001 receives the output signal 913 of the buffering amplifier 905 and the output signal 915 of the frequency multiplier 903. Buffering amplifier output signal 913 is applied to a data input of the first flip-flop 1001 and frequency multiplier output signal 915 is applied to a clock input of the first flip-flop 1001. The first flip-flop 1001 preferably samples signal 913 during a negative cycle of signal 915 to produce its output signal. The output of the first flip-flop 1001 comprises a first output signal 917 of the signal generator 900 and is also applied to a data input of the second flip-flop 1002. The clock input of the second flip-flop 1002 receives an inverted representation of the frequency multiplier output signal 915. Thus, the second flip-flop 1002 preferably samples the output signal of the first flip-flop 1001 during a positive cycle of signal 915 to produce its output signal. The output of the second flip-flop 1002 comprises a second output signal 919 of the signal generator 900 and is also applied to a data input of the third flip-flop 1003.

The clock input of the third flip-flop 1003 receives the frequency multiplier output signal 915 (in this case through two inversions). Thus, the third flip-flop 1003 preferably samples the output signal of the second flip-flop 1002 during a negative cycle of signal 915 to produce its output signal. The output of the third flip-flop 1003 comprises a third output signal 920 of the signal generator 900 and is also applied to a data input of the next flip-flop. The above process continues until the last flip-flop 1004 produces the Nth output signal 921 of the signal generator 900. Thus, in summary, the output signal 915 of the frequency multiplier 903 is used as the clock signal for the flip-flops 1001–1004 and the output signal of each flip-flop constitutes a corresponding one of the signal generator output signals 917–921. As embodied in FIG. 10, each generator output signal 917–921 has a single, determinate phase relative to the phase of the output signal 911 of the first signal generator 901 regardless of the state of the flip-flops 1001–1004 in the signal processor 907 because each flip-flop 1001–1004 produces a respective output signal 917–921 based directly on a representation of the first signal generator's output signal 911. That is, because the first flip-flop 1001 produces an output signal 917 at the frequency of the first signal generator's output signal 911 based directly on an input representation of the first signal generator's output signal 911 (i.e., the output signal 913 of the buffering amplifier 905) and each flip-flop 1002–1104 in the series of flip-flops produces its respective output signal 919–921 based directly on the preceding flip-flop's output, each output signal 917–921 has a direct phase relationship to the phase of the output signal 911 of the first signal generator 901.

Although not shown explicitly in FIG. 10, a capacitive load similar to the capacitive load 607 described above with regard to FIG. 6 may be used to load the last flip-flop 1004 of the signal processor 907 in order to obtain symmetrical operation of all the flip-flops 1001–1004 used in the signal processor 907.

Figure 11:
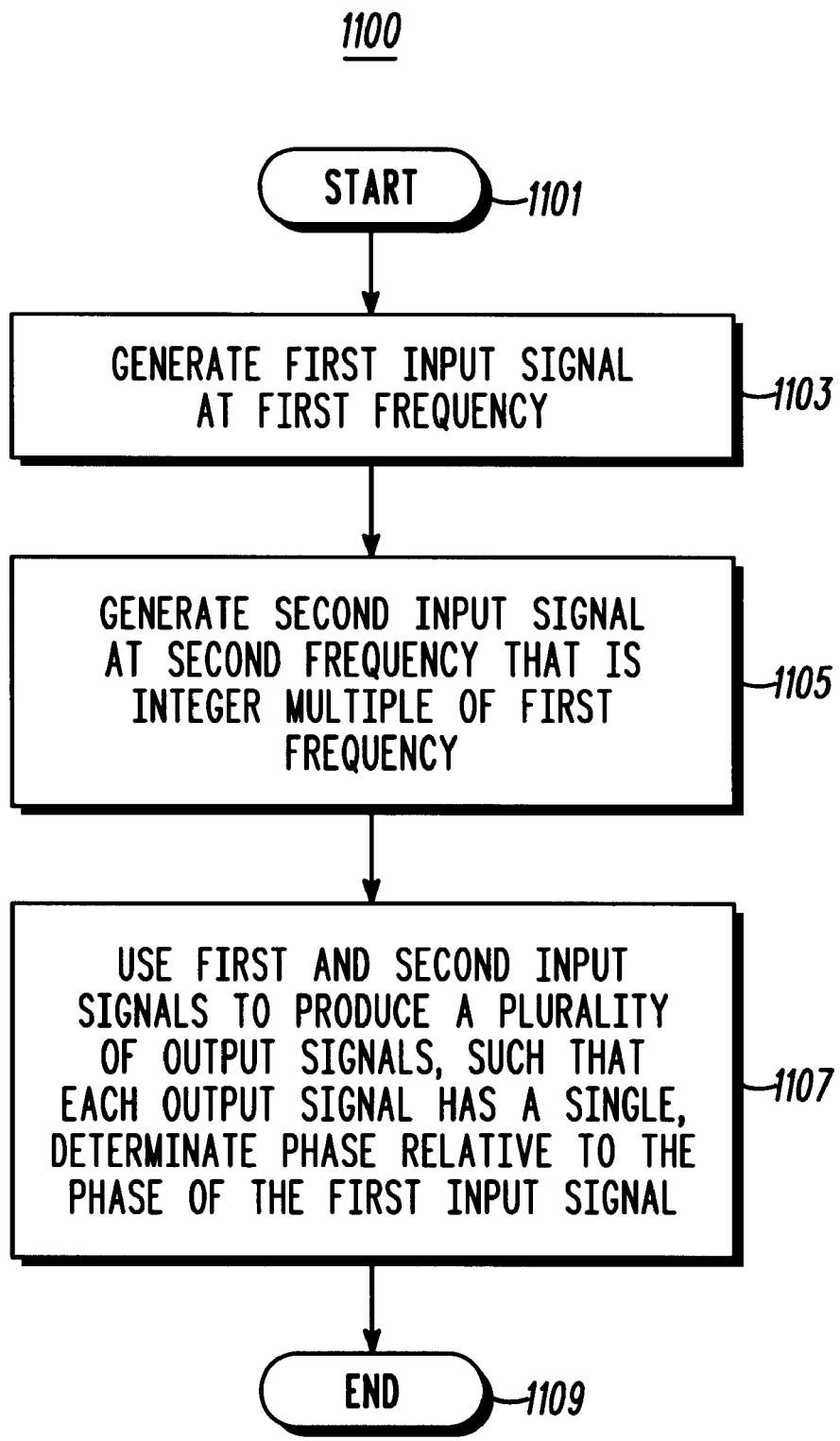
FIG. 11 illustrates a logic flow diagram of steps executed to produce a plurality of output signals with fixed phase relationships therebetween in accordance with the present invention.

FIG. 11 illustrates a logic flow diagram 1100 of steps executed to produce a plurality of output signals with fixed phase relationships therebetween in accordance with the present invention. The logic flow begins (1101) when a first signal generator generates (1103) a first input signal at a first frequency, wherein the first signal has a corresponding magnitude and phase. In a preferred embodiment, the first signal generator comprises a phase-locked oscillator and the first input signal comprises a local oscillator signal produced by the phase-locked oscillator or a phase-adjusted version thereof. The logic flow continues when a second signal generator generates (1105) a second input signal at a second frequency that is an integer multiple of the first frequency. In the preferred embodiment, the second signal generator comprises a frequency multiplier coupled to receive the first input signal and produce the second input signal as a frequency multiplied version of the first input signal. The integer multiple is selected to be equal to the number of desired output signals.

Upon generation of the first and second input signals, the first and second input signals are used (1107)—e.g., by a signal processor, such as any one of the signal processors described above—to produce a plurality of output signals at the first frequency having fixed phase relationships therebetween, such that each output signal has at all times a single, determinate phase relative to the phase of the first input signal. In the preferred embodiment, the output signals are produced by a signal processor containing multiple cascaded flip-flops, wherein the second input signal (or an inverted representation thereof) is used as the clock signal to the flip-flops and the first input signal is used as the data input signal to a first flip-flop of the cascade. The output signal of each flip-flop constitutes both the input signal to the next flip-flop in the cascade and an output signal of the plurality of output signals. Thus, since the data input to the first flip-flop is the first input signal, the output signal of the first flip-flop has a direct phase relationship to the first input signal. Likewise, since the data input to the second flip-flop is the output signal of the first flip-flop, the output signal of the second flip-flop has a direct phase relationship to the output signal of the first flip-flop, which in turn has a direct phase relationship to the first input signal, and so on for each flip-flop. Therefore, each of the plurality of output signals has a single, determinate phase relative to the phase of the first input signal. This single, determinate phase relationship exists regardless of the state of any flip-flop because the output signal of each flip-flop is at all times based on the first input signal.

In addition to having a direct phase relationship to the first input signal, the processor that uses the first and second input signals to produce the plurality of output signals is constructed as described above to produce output signals with desired phase relationships between them (e.g., output signals that are in phase quadrature with each other), thereby permitting the output signals to be used as mixer injection signals in a quadrature modulator or demodulator. Upon generation of the output signals, the logic flow ends (1109).

The present invention encompasses an apparatus and method for producing a plurality of output signals with fixed phase relationships therebetween. With this invention, two signals at a desired carrier modulation frequency can be produced from a local oscillator signal in phase quadrature with each other and in a direct phase relationship with the local oscillator signal, thereby enabling the two signals to be used as mixer injection signals of a quadrature generator that is embodied in a Cartesian feedback linear transmitter. In contrast to prior art quadrature generators that may produce output signals at any one of multiple start-up phases with respect to the local oscillator signal, the present invention enables the quadrature generator output signals to, at all times, have a single, direct phase relationship with the local oscillator signal because the signal processor producing the generator's output signals has as its input not only a frequency multiplied clock signal, but also the local oscillator signal. Accordingly, the output signals produced by the generator's signal processor have direct phase relationships to the local oscillator signal. Therefore, the present invention eliminates the phase ambiguity associated with existing quadrature generators, thereby allowing flip-flop based quadrature generators to be used in Cartesian feedback transmitters.

While the present invention has been particularly shown and described with reference to particular embodiments thereof, it will be understood by those skilled in the art that various changes in form and details may be made therein without departing from the spirit and scope of the present invention.

We claim:

1. A circuit for producing quadrature output signals in response to an input signal, the circuit comprising:
   a frequency doubler that produces an output signal that is at twice a frequency of the input signal;
   a delay circuit that delays the input signal by an amount of time that approximately equals a delay of the frequency doubler less a period of the frequency of the input signal divided by four; and
   a signal processor, having a first input coupled to an output of the delay circuit and a second input operably coupled to an output of the frequency doubler, that produces quadrature output signals at the frequency of the input signal, wherein each of the quadrature output signals has a single, determinate phase relative to a phase of the input signal.

2. The circuit of claim 1, wherein the delay circuit comprises a buffering amplifier.

3. The circuit of claim 1, wherein the signal processor comprises:
   a first flip-flop having a first input coupled to the output of the delay circuit, a second input operably coupled to the output of the frequency doubler, and an output that produces a first quadrature output signal; and
   a second flip-flop having a first input coupled to an output of the first flip-flop, a second input coupled to receive an inverted representation of the output signal of the frequency doubler, and an output that produces a second quadrature output signal.

4. The circuit of claim 3, wherein the signal processor further comprises a capacitive load coupled to the output of the second flip-flop, wherein an impedance of the capacitive load approximates an impedance of an input to a flip-flop.

5. The circuit of claim 1, wherein the signal processor comprises:
   a first flip-flop having a data input coupled to the output of the delay circuit, a clock input operably coupled to the output of the frequency doubler, and an output;
   a second flip-flop having a data input coupled to an inverted output of the first flip-flop, a clock input coupled to receive an inverted representation of the output signal of the frequency doubler, and an output;
   a third flip-flop having a data input, a clock input coupled to receive an inverted representation of the output signal of the frequency doubler, a latch input coupled to the output of the second flip-flop, and an output that produces a first quadrature output signal; and
   a fourth flip-flop having a data input coupled to the output of the third flip-flop, a clock input coupled to receive the output signal of the frequency doubler, a latch input coupled to the output of the first flip-flop, and an output coupled to the data input of the third flip-flop, wherein the output of the fourth flip-flop produces a second quadrature output signal.

6. The circuit of claim 5, wherein the first flip-flop, the second flip-flop, the third flip-flop, and the fourth flip-flop each comprise an analog differential flip-flop.

7. A linear transmitter, comprising:
   a first information signal path including a first amplifier, a first filter, and a first upconversion mixer;
   a second information signal path including a second amplifier, a second filter, and a second upconversion mixer;
   an oscillator circuit that produces a local oscillator signal at a first frequency;
   a first quadrature generator coupled to injection signal inputs of the first upconversion mixer and the second upconversion mixer, wherein the first quadrature generator includes:
      a first frequency doubler coupled to an output of the oscillator circuit that produces a first doubled output signal at a second frequency, wherein the second frequency is twice the first frequency;
      a first delay circuit coupled to an output of the oscillator circuit that delays the local oscillator signal by an amount of time that approximately equals a delay of the first frequency doubler less a period of the first frequency divided by four; and
      a first signal processor, having a first input coupled to an output of the first delay circuit and a second input operably coupled to an output of the first frequency doubler, that produces first quadrature output signals at the first frequency, wherein each of the first quadrature output signals has a single, determinate phase relative to the phase of the local oscillator signal;
   a combined information signal path coupled to the first information signal path and the second information signal path, and including a summer and an amplifier;
   a first feedback signal path coupled between an output of the combined information signal path and an input to the first information signal path, and including a first down-conversion mixer;

a second feedback signal path coupled between an output of the combined information signal path and an input to the second information signal path, and including a second down-conversion mixer; and a second quadrature generator coupled to injection signal inputs of the first down-conversion mixer and the second down-conversion mixer, wherein the second quadrature generator includes:
- a second frequency doubler operably coupled to an output of the oscillator circuit that produces a second doubled output signal at the second frequency;
- a second delay circuit operably coupled to an output of the oscillator circuit that delays the local oscillator signal by an amount of time that approximately equals a delay of the second frequency doubler less a period of the first frequency divided by four; and
- a second signal processor, having a first input coupled to an output of the second delay circuit and a second input operably coupled to an output of the second frequency doubler, that produces second quadrature output signals at the first frequency, wherein each of the second quadrature output signals has a single, determinate phase relative to the phase of the local oscillator signal.

8. The linear transmitter of claim 7, further comprising:

a phase adjustment circuit, coupled between the oscillator circuit and the second quadrature generator, that adjusts a phase of the local oscillator signal provided to the second quadrature generator to ensure negative feedback operation of the linear transmitter.

\* \* \* \* \*